United States Patent
Sasaki

(10) Patent No.: US 6,676,457 B2
(45) Date of Patent: Jan. 13, 2004

(54) CONNECTOR AND METHOD FOR CONNECTING A CONNECTOR TO A PRINTED-CIRCUITED BOARD

(75) Inventor: Harehide Sasaki, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 10/209,980

(22) Filed: Jul. 31, 2002

(65) Prior Publication Data

US 2003/0027443 A1 Feb. 6, 2003

(30) Foreign Application Priority Data

Aug. 1, 2001 (JP) ........................................ 2001-233111

(51) Int. Cl.$^7$ ................................................ H01R 4/02
(52) U.S. Cl. .......................................... 439/876; 439/79
(58) Field of Search .......................... 439/79, 381, 885, 439/83, 876

(56) References Cited

U.S. PATENT DOCUMENTS

| 4,433,892 | A | * | 2/1984 | Seidler ........................ 439/527 |
| 4,780,098 | A | * | 10/1988 | Seidler ........................ 439/876 |
| 5,334,059 | A | * | 8/1994 | Seidler ........................ 439/876 |
| 6,099,365 | A | * | 8/2000 | Cachina et al. ............. 439/876 |

* cited by examiner

*Primary Examiner*—Gary Paumen
(74) *Attorney, Agent, or Firm*—Sheridan Ross PC

(57) ABSTRACT

A method for connecting a connector to a printed-circuit board that maintains the optimal terminal alignment accuracy and improves the terminal soldering reliability. The method includes forming a fastener for fastening the terminals from a metal having a fusion point that is substantially the same as solder, fastening the terminals at predetermined positions with the fastener in a state in which the terminals are accurately aligned to one another, inserting the terminals into the through holes, and releasing the terminals by fusing the fastener.

4 Claims, 2 Drawing Sheets

CONNECTOR AND METHOD FOR CONNECTING A CONNECTOR TO A PRINTED-CIRCUITED BOARD

BACKGROUND OF THE INVENTION

The present invention relates to a connector and to a method for connecting a connector to a printed-circuit board.

A connector of a printed-circuit board has terminals, which are connected to a printed-circuit board. The terminals are soldered in through holes of the printed-circuit board. This connects the connector to the printed-circuit board.

It is difficult to accurately align the terminals with one another. Thus, to facilitate the insertion of the terminals, the diameter of the through holes must be significantly larger than the size of the terminals.

However, the reliability of the soldering decreases when the diameter of the through holes is significantly larger than the size of the terminals. This may cause, for example, cracking of the solder. Further, the large diameter of the through holes makes it difficult to decrease the pitch between terminals. As a result, the connector cannot be made more compact.

Therefore, a resin plate is attached to the terminals, to hold the terminal ends. By using the resin plate, the terminals are prevented from being deformed. However, the terminal alignment accuracy is insufficient due to the attaching tolerance, dimensional tolerance, and positional tolerance of the resin plate.

SUMMARY OF THE INVENTION

It is an object of the present invention to provide a connector and a method for connecting a connector to a printed-circuit board that maintains the optimal terminal alignment accuracy and improves the terminal soldering reliability.

To achieve the above object, the present invention provides a method for connecting a connector to a printed-circuit board having a plurality of through holes. The connector includes a case and a plurality of terminals attached to the case. The method includes forming a fastener from a metal having a fusion point that is substantially the same as solder to fasten the terminals, fastening the terminals at predetermined positions with the fastener in a state in which the terminals are accurately aligned to one another, inserting the terminals into the through holes, and releasing the terminals by fusing the fastener.

A further perspective of the present invention is a connector connected to a printed-circuit board having a plurality of through holes. The connector includes a case, a plurality of terminals attached to the case and soldered in the through holes to connect the connector to the printed-circuit board, and a fastener attached to the terminals to fasten the terminals at predetermined positions in a state in which the terminals are accurately aligned to one another. The fastener is formed from a metal having a fusion point that is substantially the same as solder.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1A:
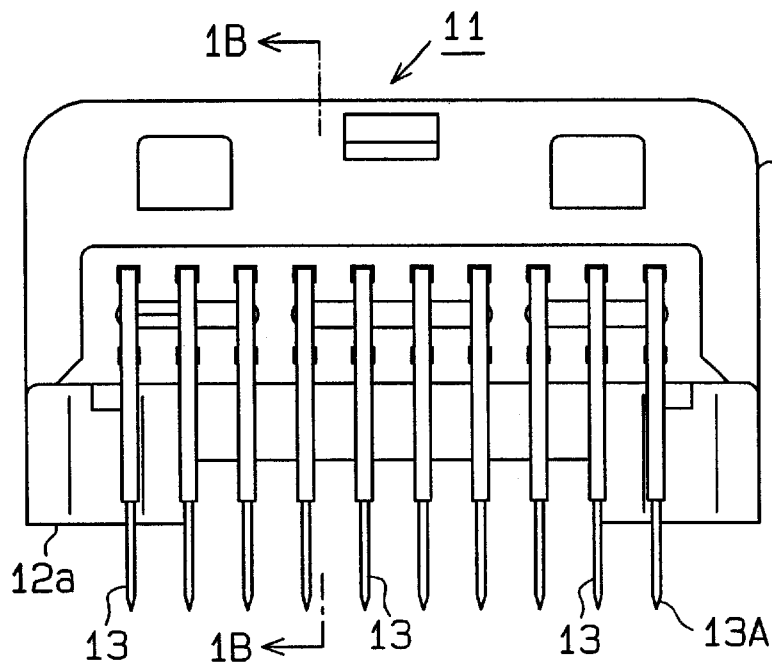
FIG. 1A is a schematic front view showing a connector according to a preferred embodiment of the present invention is a state prior to the attachment of a fastener.

In the drawings, like numerals are used for like elements throughout.

A connector 11 according to a preferred embodiment of the present invention will now be discussed with reference to FIGS. 1 to 4.

Figure 1B:
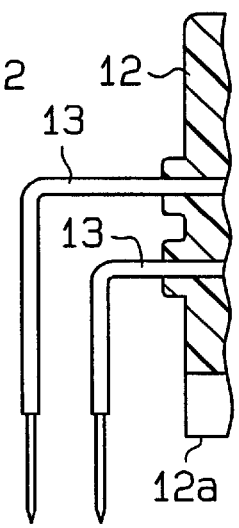
FIG. 1B is a schematic cross-sectional view taken along line 1B—1B in FIG. 1A.

FIG. 1A is a schematic front view showing the connector 11 in a state prior to the attachment of a fastener 15. FIG. 1B is a schematic cross-sectional view taken along line 1B—1B in FIG. 1A. As shown in FIGS. 1A and 1B, the connector 11 has a resin case 12. A plurality of (twenty) terminals 13 are press-fitted in the case 12. In the preferred embodiment, two rows (upper and lower rows) of L-shaped terminals 13 are attached to the case 12.

Figure 2:
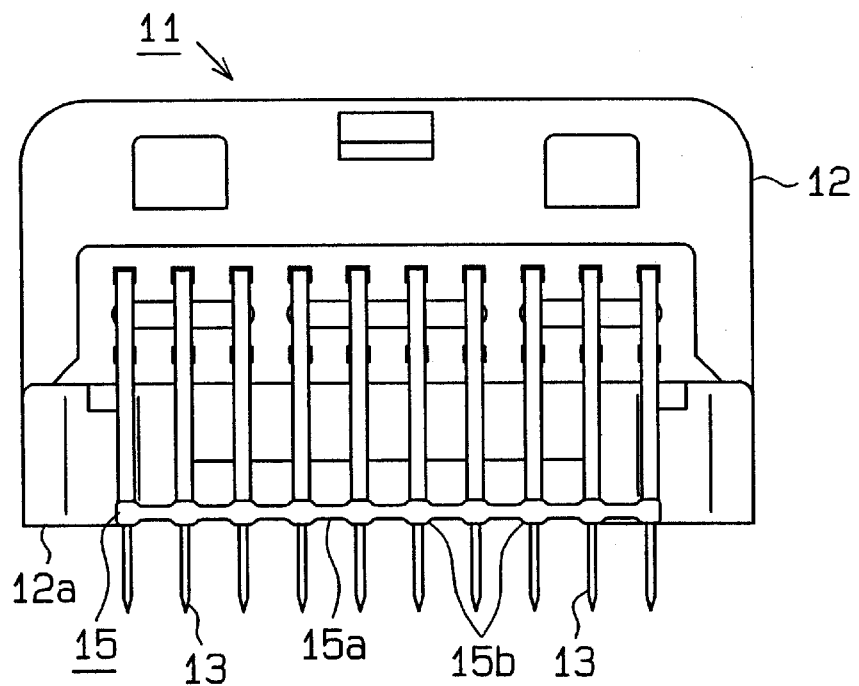
FIG. 2 is a schematic front view showing the connector of FIG. 1A in a state in which terminals are fastened by the fastener.

Referring to FIG. 2, in a state in which the terminals 13 are accurately aligned with one another, a fastener 15, which is formed from solder, fastens the terminals 13 at predetermined positions. The fastener 15 is located at a position that is slightly above an attaching surface 12a, along which the case 12 is attached to a printed-circuit board. The fastener 15 is formed by injecting solder into a predetermined mold. The predetermined mold is formed so that the terminals 13 are accurately aligned with each other when arranged in the mold.

In the preferred embodiment, the fastener 15 is plate-like and includes a plurality of connecting portions 15a, which extend between adjacent terminals 13, and holding portions 15b, which encircle and hold the terminals 13. The holding portions 15b are thicker than the connecting portions 15a.

A method for connecting the connector 11 to a printed-circuit board 21 will now be discussed.

Figure 3:
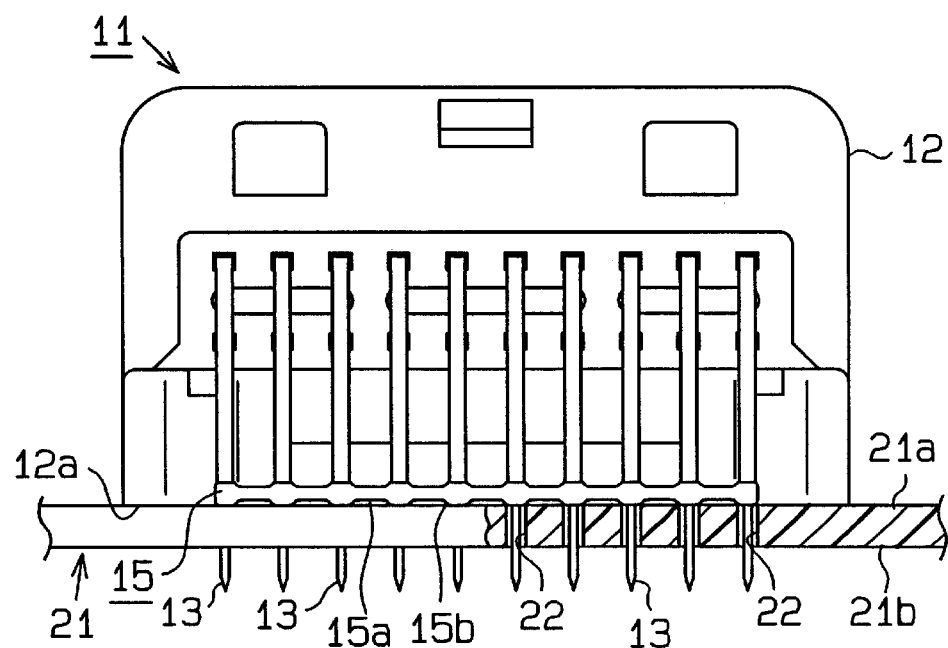
FIG. 3 is a partially cross-sectional view showing the connector of FIG. 1A in a state arranged on a printed-circuit board.
Figure 4:
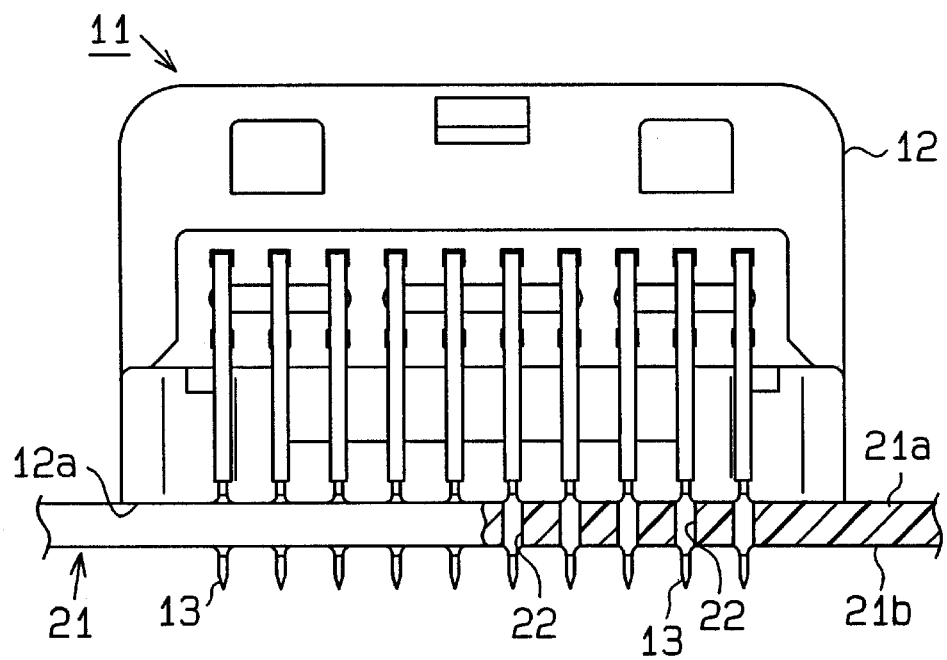
FIG. 4 is a partially cross-sectional view showing the terminals of the connector of FIG. 1A in a soldered state.

As shown in FIG. 3, the printed-circuit board 21 has a plurality of through holes 22 corresponding to the terminals 13. In the preferred embodiment, a conductive pattern is printed on both sides of the printed-circuit board 21. In FIGS. 3 and 4, the through holes 22 are shown having a diameter that is greater than actual.

The terminals 13 are inserted in the through holes 22 of the printed-circuit board 21. The connector 11 is arranged on a mounting surface 21a of the printed-circuit board 21 with the attaching surface 12a contacting the mounting surface 21a. In this state, the fastener 15 is located just above the mounting surface 21a.

In a state in which the case 12 is mounted, the printed-circuit board 21 is placed in a furnace, such as an infrared furnace, and heated to melt the fastener 15. The fusion of the fastener 15 releases the terminals 13. This disconnects the terminals 13 from one another. The fused fastener 15, or the fused solder, enters the through holes 22. With reference to FIG. 4, the fused solder in the through holes 22 then solders the terminals 13 to the printed-circuit board 21.

The preferred embodiment has the advantages described below.

(1) The terminals 13 of the connector 11 are fixed by the fastener 15, which is made of metal (solder), in an accurately aligned state. This facilitates the insertion of the terminals 13 into the through holes 22 of the printed-circuit board 21.

(2) The fastener 15 keeps the terminals 13 in an accurately aligned state. Thus, the terminals 13 are easily inserted into the through holes 22 even when the diameter of the through holes 22 is reduced. Reduction in the diameter of the through holes 22 prevents the solder from cracking. This improves the soldering reliability of the terminals 13.

(3) By reducing the diameter of the through holes 22, the pitch of the through holes 22 and the pitch of the terminals 13 are decreased. This enables the connector 11 to be made more compact.

(4) The fastener 15 is melted and fused. Thus, the fastener 15 is removed in a relatively simple manner.

(5) The fused fastener (solder) 15 solders the terminals 13 to the printed-circuit board 21. Thus, additional solder is not required.

(6) The fastener 15 is arranged on the terminals 13 at a position that is slightly higher than the attaching surface 12a. Thus, when the connector 11 is arranged on the mounting surface 21a, the fastener 15 is located just above the mounting surface 21a. As a result, the fused fastener (solder) 15 enters the through holes 22 and optimally solders the terminals 13 to the printed-circuit board 21.

(7) The holding portions 15b are thicker than the connecting portions 15a in the fastener 15. Thus, when the fastener 15 fuses, the connecting portions 15a fuse more easily than the holding portions 15b. Consequently, the terminals 13 are released and disconnected from each other while the holding portions 15b are provided with the necessary amount of solder.

It should be apparent to those skilled in the art that the present invention may be embodied in many other specific forms without departing from the spirit or scope of the invention. Particularly, it should be understood that the present invention may be embodied in the following forms.

Additional terminals 13 may be soldered to a rear surface 21b of the printed-circuit board 21 that is opposite to the mounting surface 21a. In this case, the fused fastener (solder) 15 may be used only to solder the terminals 13 that are connected to the mounting surface 21a, and conventional soldering may be performed to solder the terminals 13 that are connected to the rear surface 21b. This would decrease the solder amount of the fastener 15.

The fastener 15 may be formed separately from the terminals 13, and holes may be formed in the fastener 15 for insertion of the terminals 13. In this case, the terminals 13 are inserted through the holes in an accurately aligned state.

Solder having a decreased lead content or solder that is free of lead may be used to form the fastener 15.

The fastener 15 may be formed from a metal having a fusion point that is substantially equal to that of solder. In this case, the fused fastener 15, or fused metal, may be eliminated without being used to solder the terminals 13. Solder is prepared to solder the terminals 13.

The printed-circuit board 21 may be a single-sided board on which the conductive pattern is printed on only the mounting surface 21a.

The terminals 13 may be insert molded to the connector 11.

The furnace used to heat the fastener 15 may be a hot blast furnace. Further, the fastener 15 does not necessarily have to be fused by the heat of a furnace.

The fastener 15 may be formed at a position separated from the attaching surface 12a toward the distal portions (13A) of the terminals 13.

The terminals 13 may be arranged in any number of rows on the connector 11.

The terminals 13 may be arranged along the same line on the mounting surface 21a of the connector 11.

The present examples and embodiments are to be considered as illustrative and not restrictive, and the invention is not to be limited to the details given herein, but may be modified within the scope and equivalence of the appended claims.

What is claimed is:

1. A connector connected to a printed-circuit board having a plurality of through holes, the connector comprising:

a case;

a plurality of terminals attached to the case and soldered in the through holes to connect the connector to the printed-circuit board; and a fastener attached to the terminals to fasten the terminals at predetermined positions in a state in which the terminals are accurately aligned to one another, wherein the fastener is formed from a metal having a fusion point that is substantially the same as solder.

2. The connector according to claim 1, wherein:

the fastener is formed from solder;

the case has an attaching surface that contacts the printed-circuit board when the connector is connected to the printed-circuit board; and the fastener fastens the terminals at a position that is slightly higher than the attaching surface of the case.

3. The connector according to claim 1, wherein the fastener includes a connection portion, which connects the terminals, and a holding portion, which is provided for each terminal to hold the terminal, wherein each holding portion is thicker than the connecting portion.

4. A connector connected to a printed-circuit board having a plurality of through holes, the connector comprising:

a case;

a plurality of terminals attached to the case and soldered in the through holes to connect the connector to the printed-circuit board; and a fastener attached to the terminals to fasten the terminals at predetermined positions, wherein the fastener is formed from a metal having a fusion point that is substantially the same as solder.

* * * * *